United States Patent
Park et al.

(10) Patent No.: US 10,892,185 B2
(45) Date of Patent: Jan. 12, 2021

(54) SEMICONDUCTOR DEVICE INCLUDING A BLOCKING PATTERN IN AN INTERCONNECTION LINE

(71) Applicant: SAMSUNG ELECTRONICS CO., LTD., Suwon-si (KR)

(72) Inventors: Sangjun Park, Seoul (KR); Haewang Lee, Yongin-si (KR); Jaemyung Choi, Busan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/511,019

(22) Filed: Jul. 15, 2019

(65) Prior Publication Data

US 2020/0105578 A1 Apr. 2, 2020

(30) Foreign Application Priority Data

Sep. 28, 2018 (KR) .................. 10-2018-0115947

(51) Int. Cl.
*H01L 21/768* (2006.01)
*H01L 23/522* (2006.01)
*H01L 23/532* (2006.01)
*H01L 23/528* (2006.01)

(52) U.S. Cl.
CPC .... *H01L 21/7682* (2013.01); *H01L 21/76816* (2013.01); *H01L 21/76877* (2013.01); *H01L 23/528* (2013.01); *H01L 23/5226* (2013.01); *H01L 23/5329* (2013.01)

(58) Field of Classification Search
None
See application file for complete search history.

(56) References Cited

U.S. PATENT DOCUMENTS

| | | | |
|---|---|---|---|
| 6,917,109 B2 | 7/2005 | Lur et al. | |
| 7,913,221 B2 | 3/2011 | Miyashita et al. | |
| 9,496,169 B2 | 11/2016 | Tung et al. | |
| 9,881,870 B2* | 1/2018 | Wu | H01L 21/76877 |
| 9,960,117 B2 | 5/2018 | Gates et al. | |
| 10,490,447 B1* | 11/2019 | Cheng | H01L 23/5226 |
| 2016/0147928 A1 | 5/2016 | Ho et al. | |
| 2016/0172231 A1* | 6/2016 | Lee | H01L 21/31111 438/643 |
| 2017/0278786 A1 | 9/2017 | Inoue et al. | |
| 2018/0145035 A1 | 5/2018 | Singh et al. | |

FOREIGN PATENT DOCUMENTS

KR 10-2018-0020252 A 2/2018

* cited by examiner

*Primary Examiner* — J. E. Schoenholtz
(74) *Attorney, Agent, or Firm* — Lee IP Law, P.C.

(57) ABSTRACT

A semiconductor device including a first interconnection line having a first end and extending in a first direction; a first blocking pattern at the first end of the first interconnection line and adjacent to the first interconnection line in the first direction; a second interconnection line spaced apart from the first interconnection line in a second direction crossing the first direction and extending in the first direction, the second interconnection line having a second end; and a second blocking pattern at the second end of the second interconnection line and adjacent to the second interconnection line in the first direction, wherein a width of the first blocking pattern in the first direction is different from a width of the second blocking pattern in the first direction.

20 Claims, 17 Drawing Sheets

SEMICONDUCTOR DEVICE INCLUDING A BLOCKING PATTERN IN AN INTERCONNECTION LINE

CROSS-REFERENCE TO RELATED APPLICATION

Korean Patent Application No. 10-2018-0115947, filed on Sep. 28, 2018, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

As semiconductor devices have been highly integrated, pitches of patterns in the semiconductor devices have been reduced.

SUMMARY

The embodiments may be realized by providing a semiconductor device including a first interconnection line having a first end and extending in a first direction; a first blocking pattern at the first end of the first interconnection line and adjacent to the first interconnection line in the first direction; a second interconnection line spaced apart from the first interconnection line in a second direction crossing the first direction and extending in the first direction, the second interconnection line having a second end; and a second blocking pattern at the second end of the second interconnection line and adjacent to the second interconnection line in the first direction, wherein a width of the first blocking pattern in the first direction is different from a width of the second blocking pattern in the first direction.

The embodiments may be realized by providing a semiconductor device including an insulating layer on a substrate; a first interconnection line and a second interconnection line in the insulating layer and opposed to each other in a first direction, the first interconnection line and the second interconnection line extending in the first direction; a first blocking pattern between the first interconnection line and the second interconnection line in the insulating layer; and an air gap at one side of the first blocking pattern in the insulating layer and extending in the first direction.

BRIEF DESCRIPTION OF THE DRAWINGS

Features will be apparent to those of skill in the art by describing in detail exemplary embodiments with reference to the attached drawings in which:

FIGS. 3A to 13A illustrate plan views of stages in a method of fabricating a semiconductor device according to some embodiments.

FIGS. 3B to 13B illustrate cross-sectional views taken along lines I-I' of FIGS. 3A to 13A, respectively.

DETAILED DESCRIPTION

Figure 1A:
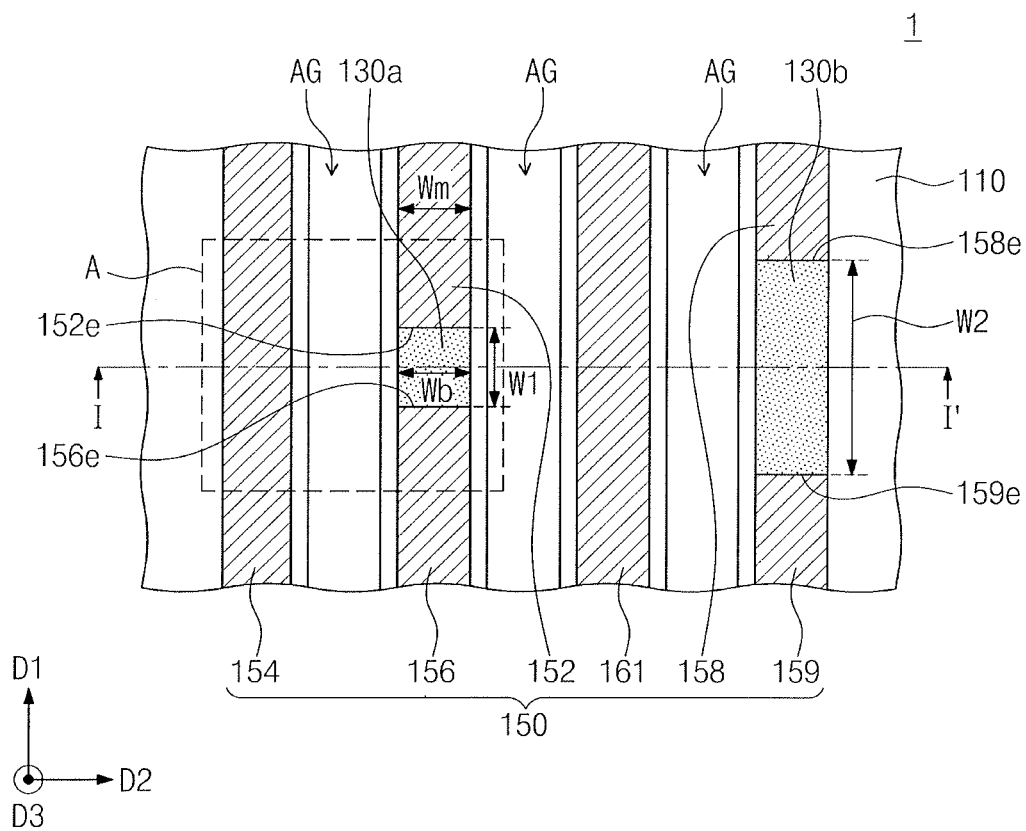
FIG. 1A illustrates a plan view of a semiconductor device according to some embodiments.
Figure 1B:
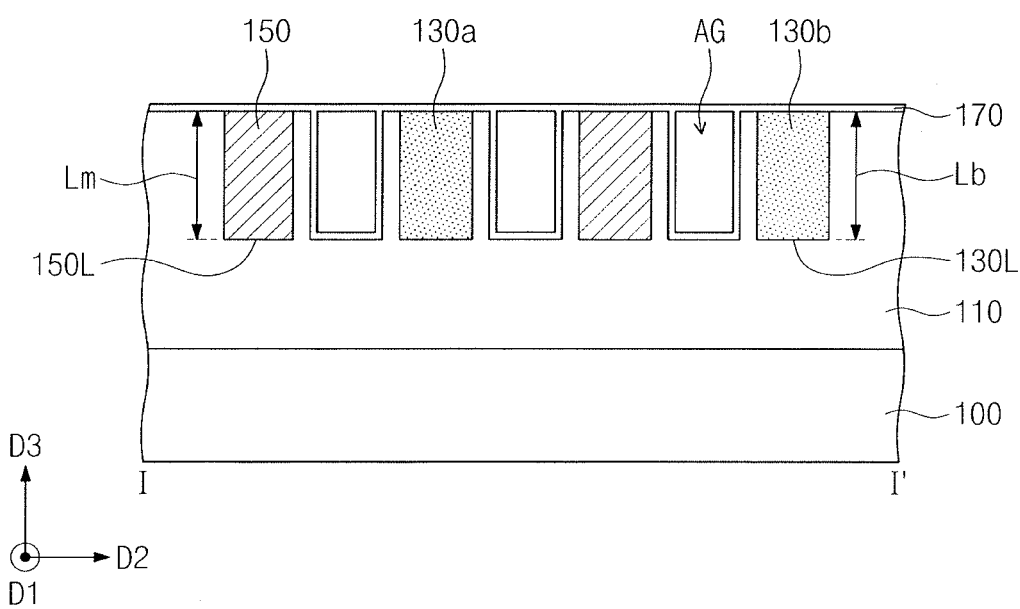
FIG. 1B illustrates a cross-sectional view taken along a line I-I' of FIG. 1A.

FIG. 1A illustrates a plan view of a semiconductor device 1 according to some embodiments, and FIG. 1B illustrates a cross-sectional view taken along a line I-I' of FIG. 1A. In the drawings of the present specification, sizes and/or ratios of some components or elements may be exaggerated or reduced as compared to their real sizes and/or ratios for the purpose of ease and convenience in description and illustration. For example, sizes and/or ratios of illustrated components or elements may be different from their real sizes and/or ratios. In an implementation, a semiconductor device 1 may be a logic device. In an implementation, the semiconductor device 1 may be a memory device.

Referring to FIGS. 1A and 1B, the semiconductor device 1 may include a substrate 100, an insulating layer 110, an interconnection structure 150, a first blocking pattern 130a, a second blocking pattern 130b, air gaps AG, and a capping layer 170.

The substrate 100 may be a semiconductor substrate that includes silicon (Si), silicon-germanium (Site), germanium (Ge), or gallium-arsenic (GaAs). In an implementation, the substrate 100 may be a silicon-on-insulator (SOI) substrate.

The insulating layer 110 may be on the substrate 100. The insulating layer 110 may be an interlayer insulating layer between the substrate 100 and an upper insulating layer. In an implementation, the insulating layer 110 may be another kind or type of insulating layer including the interconnection structure 150 and the air gap AG therein. In an implementation, transistors or memory elements and lower interconnection structures electrically connected to the transistors or memory elements may be between the substrate 100 and the insulating layer 110, based on a kind of the semiconductor device 1. The insulating layer 110 may include a low-k dielectric material, e.g., a dielectric material having a dielectric constant of 2 to 5. The insulating layer 110 may include, e.g., undoped silica glass (USG), boro silica glass (BSG), phospho silica glass (PSG), boro phospho silica glass (BPSG), aerogel, amorphous fluorinated carbon, organo silicate glass (OSG), polyimide, a porous polymeric material, organosilicon, or a combination thereof.

The interconnection structure 150 may be in the insulating layer 110. The interconnection structure 150 may include a plurality of interconnection lines 150. In the present specification, the interconnection structure 150 may be referred to as the interconnection lines 150 where appropriate. In an implementation, the interconnection lines 150 may include a first interconnection line 152, a second interconnection line 154, a third interconnection line 156, a fourth interconnection line 158, a fifth interconnection line 159, and a sixth interconnection line 161. The first, second, and third interconnection lines 152, 154, and 156 may be the interconnection lines of one region A. The one region 'A' may be a region that includes an end portion of at least one interconnection line, e.g., a cut region of an interconnection line. The first, second, and third interconnection lines 152, 154, and 156 may be the same or similar kind of interconnection lines.

The first interconnection line 152 may have a first end portion 152e. The first interconnection line 152 may extend in one direction. Hereinafter, the first interconnection line 152 extending in a first direction D1 will be described as an example for the purpose of ease and convenience in description.

The second interconnection line 154 may be adjacent to the first interconnection line 152. For example, an additional interconnection line may not be between the first interconnection line 152 and the second interconnection line 154. For example, the first and second interconnection lines 152 and 154 may be adjacent to each other (e.g., spaced apart in a second direction D2 perpendicular to the first direction D1). The second interconnection line 154 may extend in the first direction D1 (e.g., parallel with the first interconnection line 152).

The third interconnection line 156 may have a second end portion 156e. The third interconnection line 156 may extend in the first direction D1. The second end portion 156e of the third interconnection line 156 may face the first end portion 152e of the first interconnection line 152. The first end portion 152e of the first interconnection line 152 and the second end portion 156e of the third interconnection line 156 may face each other (e.g., may be spaced apart) in the first direction D1. The third interconnection line 156 may be adjacent to the second interconnection line 154. For example, an additional interconnection line may not be between the third interconnection line 156 and the second interconnection line 154. For example, the third and second interconnection lines 156 and 154 may be adjacent to each other (e.g., and spaced apart) in the second direction D2.

The first and the second blocking patterns 130a, 130b may be in the insulating layer 110. The first blocking pattern 130a may be between the first end portion 152e of the first interconnection line 152 and the second end portion 156e of the third interconnection line 156. The first end portion 152e of the first interconnection line 152 and the second end portion 156e of the third interconnection line 156 may be opposite to each other in the first direction D1. The first blocking pattern 130a may extend in the first direction D1. The first blocking pattern 130a may be adjacent to the second interconnection line 154. The first end portion 152e of the first interconnection line 152, the first blocking pattern 130a, and the second end portion 156e of the third interconnection line 156 may be sequentially arranged in the first direction D1. A width Wb of the first blocking pattern 130a may be equal to a width Wm of each of the first and third interconnection lines 152 and 156. The widths Wb and Wm may mean lengths in the second direction D2.

The second blocking pattern 130b may be between an end portion 158e of the fourth interconnection line 158 and an end portion 149e of the fifth interconnection line 159. The second blocking pattern 130b may extend in the first direction D1. The fourth interconnection line 158 and the fifth interconnection line 159 may extend in the first direction D1. The second blocking pattern 130b may be adjacent to the fourth interconnection line 158 in the first direction D1. The first interconnection line 152 may be disposed between the second interconnection line 154 and the fourth interconnection line 158. The third interconnection line 156 may be disposed between the second interconnection line 154 and the fifth interconnection line 159. A width W1 of the first blocking pattern 130a in the first direction D1 may be different from a width W2 of the second blocking pattern 130b in the first direction D1. For example, the width W1 of the first blocking pattern 130a in the first direction D1 may be smaller than the width W2 of the second blocking pattern 130b in the first direction D1. The first blocking pattern 130a and the second blocking pattern 130b may be opposed to each other in the second direction D2. The sixth interconnection line 161 may be disposed between the first blocking pattern 130a and the second blocking pattern 130b in the insulating layer 110. The sixth interconnection line 161 may extend in the first direction D1.

A level Lb of a bottom surface 130L of each of the first and the second blocking patterns 130a, 130b (e.g., depths of the first and the blocking patterns 130a, 130b) may be substantially the same as a level Lm of a bottom surface 150L of at least one of the interconnection lines 150 (e.g., depth of the interconnection line 150). The level Lb of the bottom surface 130L of each of the blocking patterns 130a, 130b may be substantially the same as the level Lm of the bottom surface 150L of each (e.g., all) of the interconnection lines 150. In an implementation, the levels of the bottom surfaces of the interconnection lines 150 may be substantially the same as each other. The term 'level' used herein may mean a distance from a top surface of the insulating layer 110 in a direction toward the substrate 100.

The first and the second blocking patterns 130a, 130b may include a material having an etch selectivity with respect to the insulating layer 110 and the interconnection structure 150. The first and the second blocking patterns 130a, 130b may include, e.g., silicon dioxide, carbon-doped silicon dioxide, silicon nitride, silicon carbide, a metal oxide, or a metal nitride.

The air gaps AG may be in the insulating layer 110. Each of the air gaps AG may extend in the first direction D1. The air gap AG may be between the first interconnection line 152 and the second interconnection line 154 (e.g., and between the first end portion 152e of the first interconnection line 152 and the second interconnection line 154). The air gap AG may also be between the first blocking pattern 130a and the second interconnection line 154. The air gap AG may also be between the third interconnection line 156 and the second interconnection line 154 (e.g., and between the second end portion 156e of the third interconnection line 156 and the second interconnection line 154). A pair of air gaps AG may be spaced apart from each other with first and the third interconnection lines 152 and 156 therebetween. The air gap AG may include air (having a dielectric constant that is lower than that of the insulating layer 110). In the present specification, an ideal case in which sidewalls of the air gap AG are vertical to a top surface of the substrate 100 is illustrated for the purpose of ease and simplicity in illustration. In an implementation, an upper portion of the air gap AG may be narrower than a lower portion of the air gap AG.

The capping layer 170 may be on the air gaps AG and the insulating layer 110. The capping layer 170 may enclose the air gaps AG and may cover upper surfaces of the first interconnection line 152, the second interconnection line 154, the third interconnection line 156, the fourth interconnection line 158, the fifth interconnection line 159, and the sixth interconnection line 161. The capping layer 170 may also be on the trenches where the air gaps are formed. The capping layer 170 may be formed using a material having poor step coverage or poor conformality.

An upper insulating layer may be on the capping layer 170, and an upper interconnection structure may be on the upper insulating layer. Vias for electrically connecting the upper interconnection structure and the interconnection structure 150 may be additionally provided.

In some semiconductor devices including an interconnection structure, an air gap may be spaced apart from an end portion of the interconnection structure by a certain distance. According to an embodiment, the air gap AG may be between the second interconnection line 154 and the first end portion 152e of the first interconnection line 152 and between the second interconnection line 154 and the second end portion 156e of the third interconnection line 156. The first blocking pattern 130a may be between the first end portion 152e of the first interconnection line 152 and the second end portion 156e of the third interconnection line 156. For example, a formation region of the air gap AG may be expanded. As a result, a parasitic capacitance of the semiconductor device 1 may be reduced, and thus RC delay of the semiconductor device 1 may be reduced.

Figure 2:
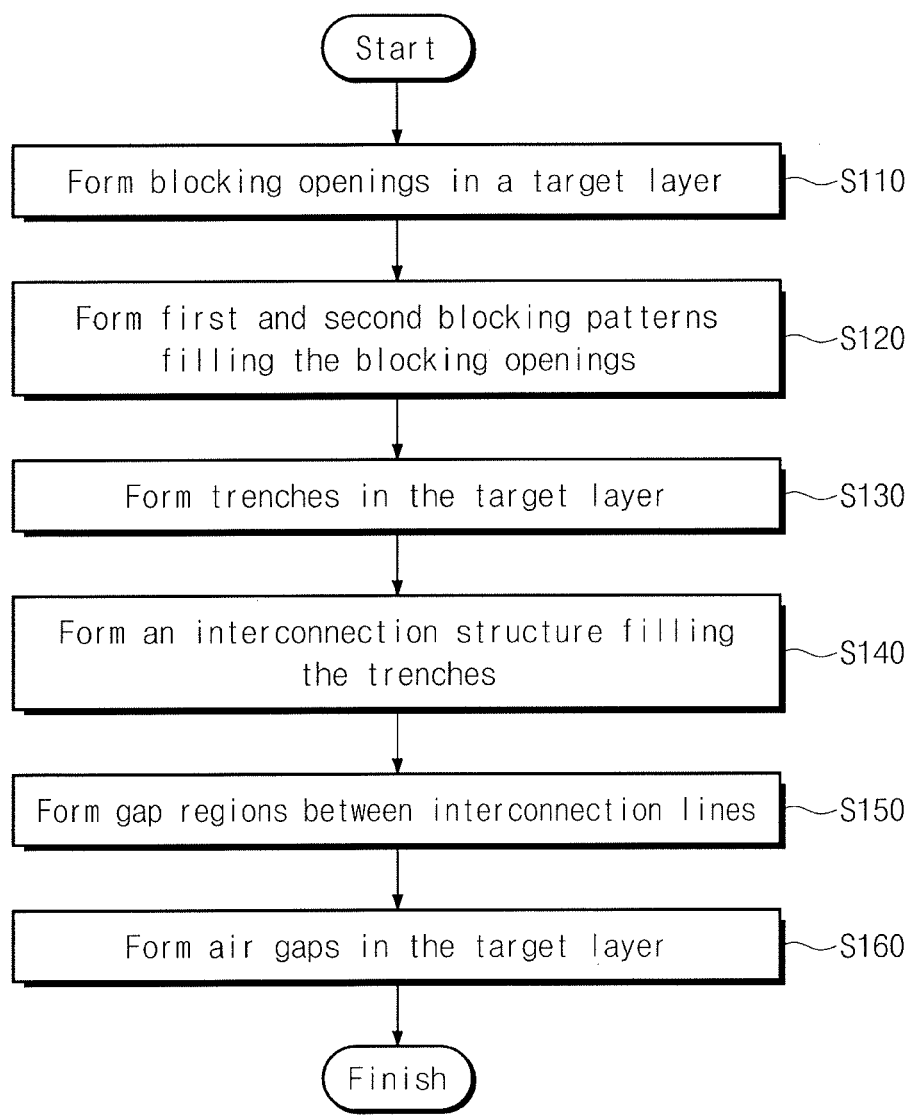
FIG. 2 illustrates a flowchart of a method of fabricating a semiconductor device according to some embodiments.

FIG. 2 illustrates a flowchart of a method of fabricating a semiconductor device according to some embodiments. FIGS. 3A to 13A illustrate plan views of stages in a method of fabricating a semiconductor device according to some. FIGS. 3B to 13B illustrate cross-sectional views taken along lines I-I' of FIGS. 3A to 13A, respectively. FIGS. 9C and 11C illustrate cross-sectional views taken along lines II-II' of FIGS. 9A and 11A, respectively.

Figure 3A:
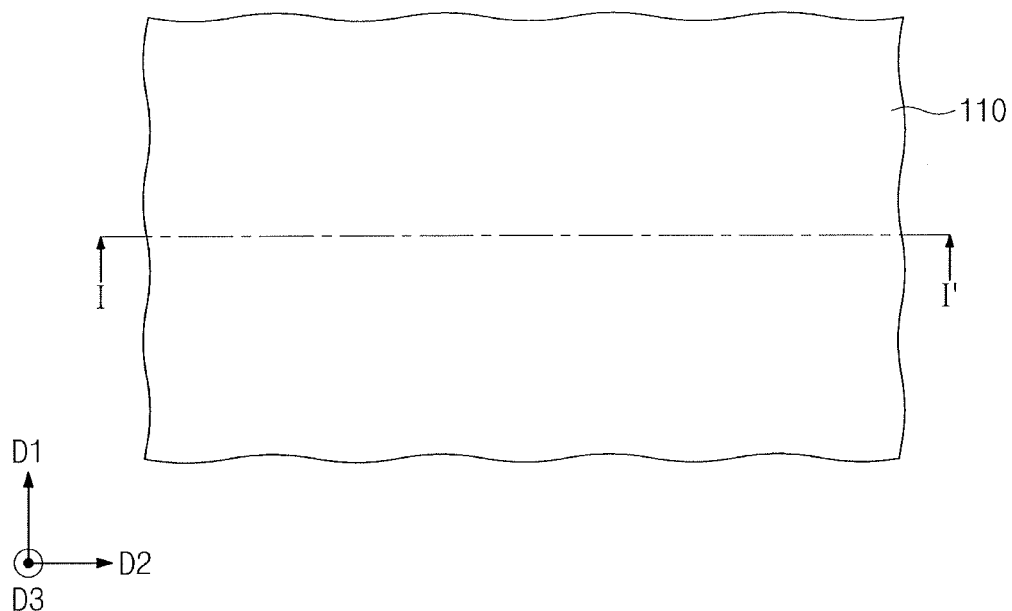
Figure 3B:
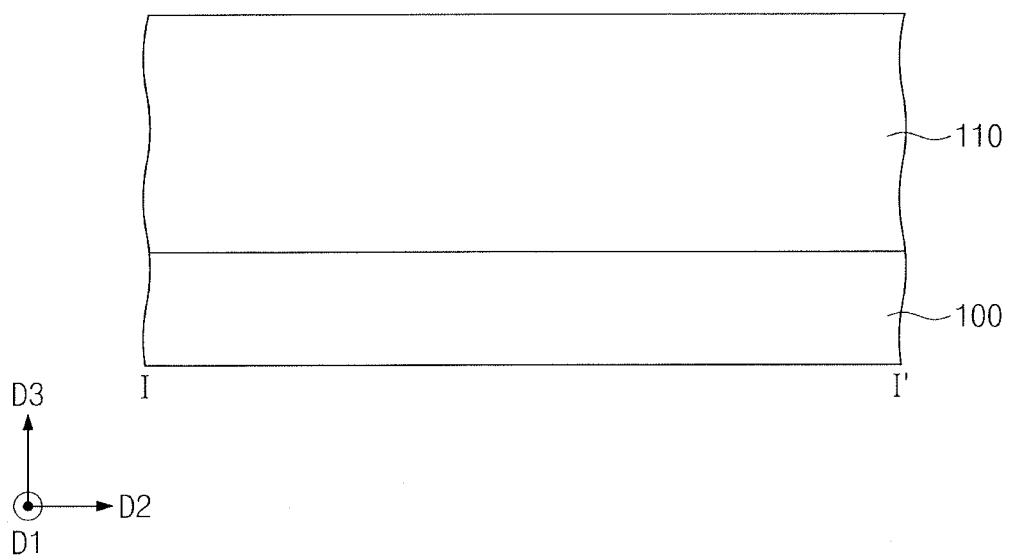

Referring to FIGS. 3A and 3B, a target layer 110 to be treated may be formed on a substrate 100. Hereinafter, an example in which the target layer 110 is an insulating layer 110 will be described. The target layer 110 may be referred to as the insulating layer 110. The substrate 100 may be a semiconductor substrate that includes silicon, silicon-germanium (SiGe), germanium (Ge), or gallium-arsenic (GaAs). In an implementation, the substrate 100 may be a silicon-on-insulator (SOI) substrate. The insulating layer 110 may be an interlayer insulating layer between the substrate 100 and upper structures.

The insulating layer 110 may include a low-k dielectric material, e.g., a dielectric material having a dielectric constant of 2 to 5. In an implementation, the insulating layer 110 may include, e.g., undoped silica glass (USG), boro silica glass (BSG), phospho silica glass (PSG), boro phospho silica glass (BPSG), aerogel, amorphous fluorinated carbon, organo silicate glass (OSG), polyimide, a porous polymeric material, organosilicon, or a combination thereof. The insulating layer 110 may be formed by, e.g., an atomic layer deposition (ALD) method, a physical vapor deposition (PVD) method, or a chemical vapor deposition (CVD) method. In an implementation, transistors or memory elements and lower interconnection structures electrically connected to the transistors or memory elements may be between the substrate 100 and the insulating layer 110, based on a kind of the semiconductor device 1.

Referring to FIGS. 2, 4A, 4B, 5A and 5B, blocking openings 113 may be formed in the insulating layer 110 (S110).

Figure 4A:
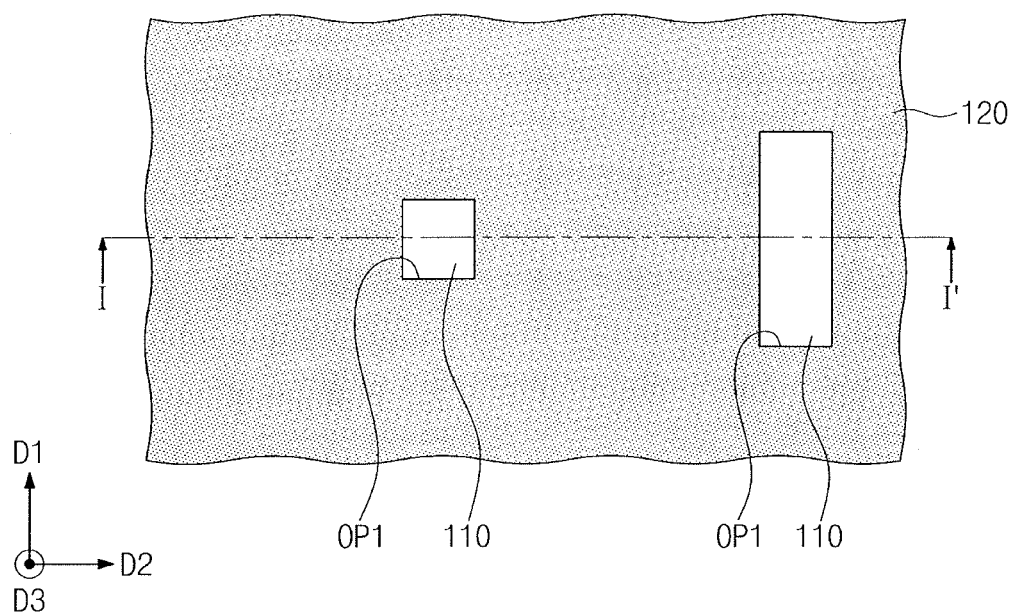
Figure 4B:
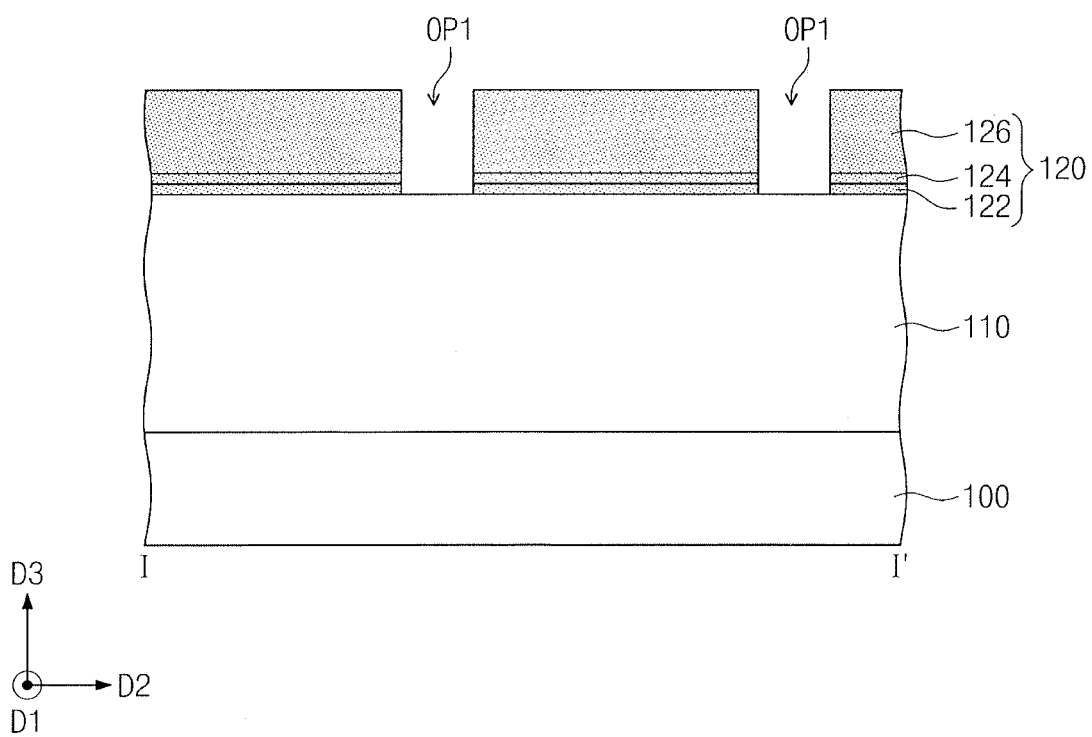

For example, referring to FIGS. 4A and 4B, a first mask pattern portion 120 having first openings OP1 may be formed on the insulating layer 110. The first mask pattern portion 120 may include a first mask pattern 122, a second mask pattern 124, and a third mask pattern 126, which are sequentially stacked. A first mask layer, a second mask layer, and a third mask layer may be sequentially stacked, and the first to third mask layers may be patterned to form the first mask pattern portion 120. For example, the first to third mask layers may be patterned using a photoresist pattern. In an implementation, the first mask pattern 122 may include TiN, the second mask pattern 124 may include SiON, and the third mask pattern 126 may include spin-on-hardmask (SOH). In an implementation, the first mask pattern portion 120 may include only one or some of the first to third mask patterns 122, 124 and 126 or may further include an additional layer.

Figure 5A:
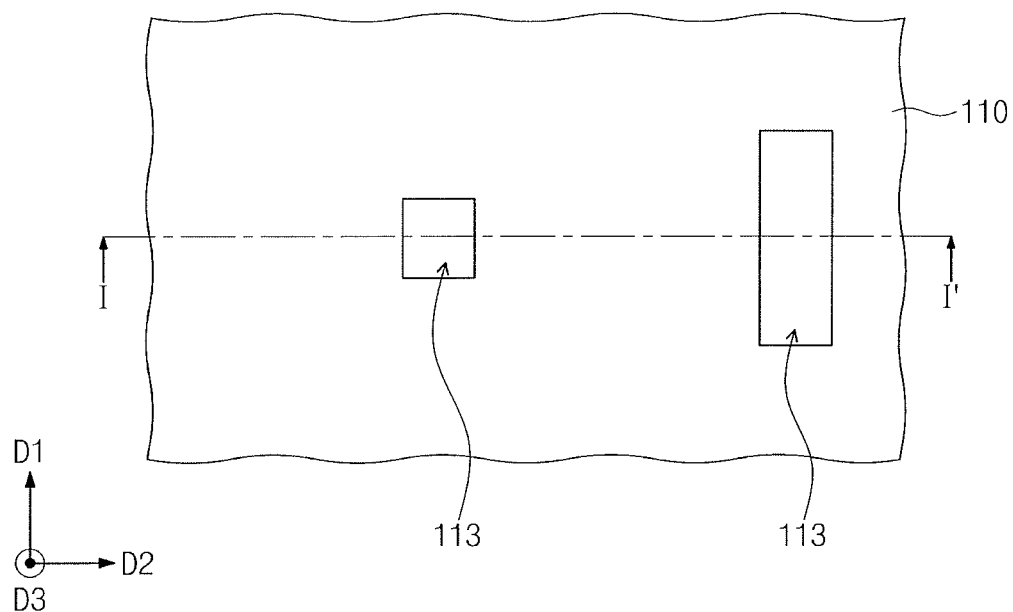
Figure 5B:
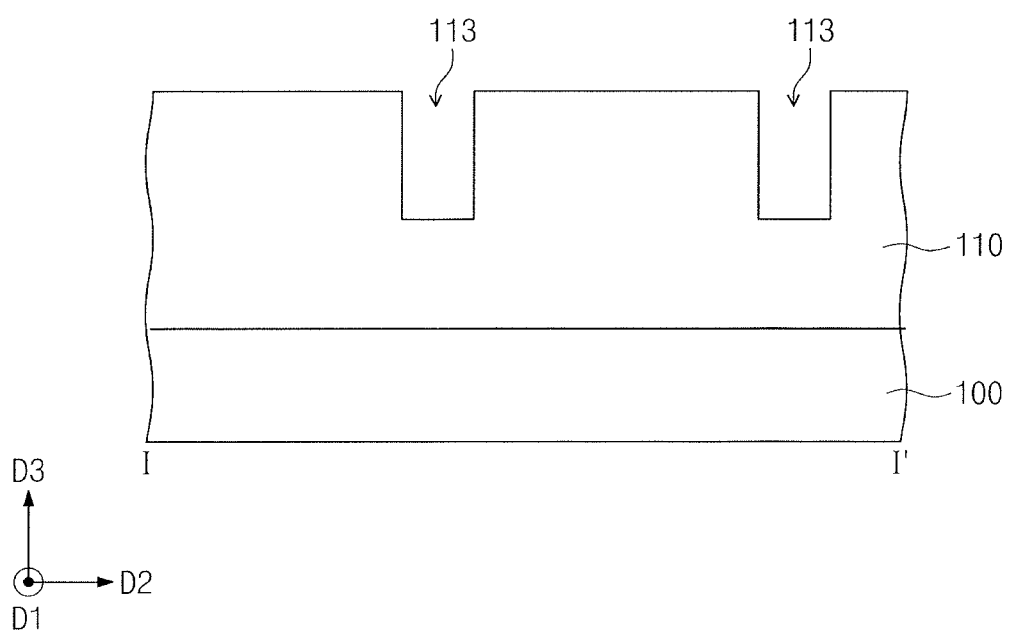

Referring to FIGS. 5A and 5B, the insulating layer 110 may be etched using the first mask pattern portion 120 as an etch mask to form the blocking openings 113 corresponding to the first openings OP1 in the insulating layer 110. The blocking openings 113 may be formed by etching the insulating layer 110 exposed through the first openings OP1. In an implementation, the insulating layer 110 may be etched using a dry etching process and/or a wet etching process. Shapes and arrangement of the first openings OP1 of the first mask pattern portion 120 may be the same as shapes and arrangement of regions between end portions of interconnection lines in the insulating layer 110 of the semiconductor device 1 and may be obtained from, e.g., a layout design of the semiconductor device 1.

The blocking openings 113 may have sidewalls that are vertical or orthogonal to a top surface of the substrate 100 as illustrated in FIG. 5B. In an implementation, the blocking openings 113 may have shapes tapered toward the substrate 100.

Thereafter, the first mask pattern portion 120 may be removed. The first mask pattern portion 120 may be removed by, e.g., ashing/strip processes. The insulating layer 110 having the blocking openings 113 may be exposed by the removal of the first mask pattern portion 120.

Referring to FIGS. 2, 6A, 6B, 7A and 7B, first and second blocking patterns 130a, 130b may be formed to fill the blocking openings 113 (S120).

Figure 6A:
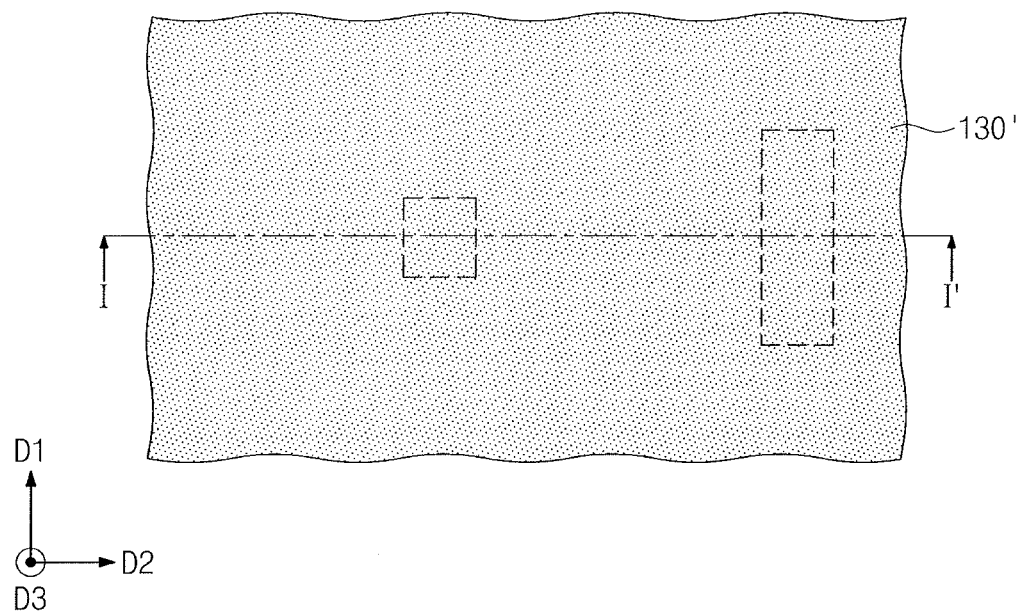
Figure 6B:
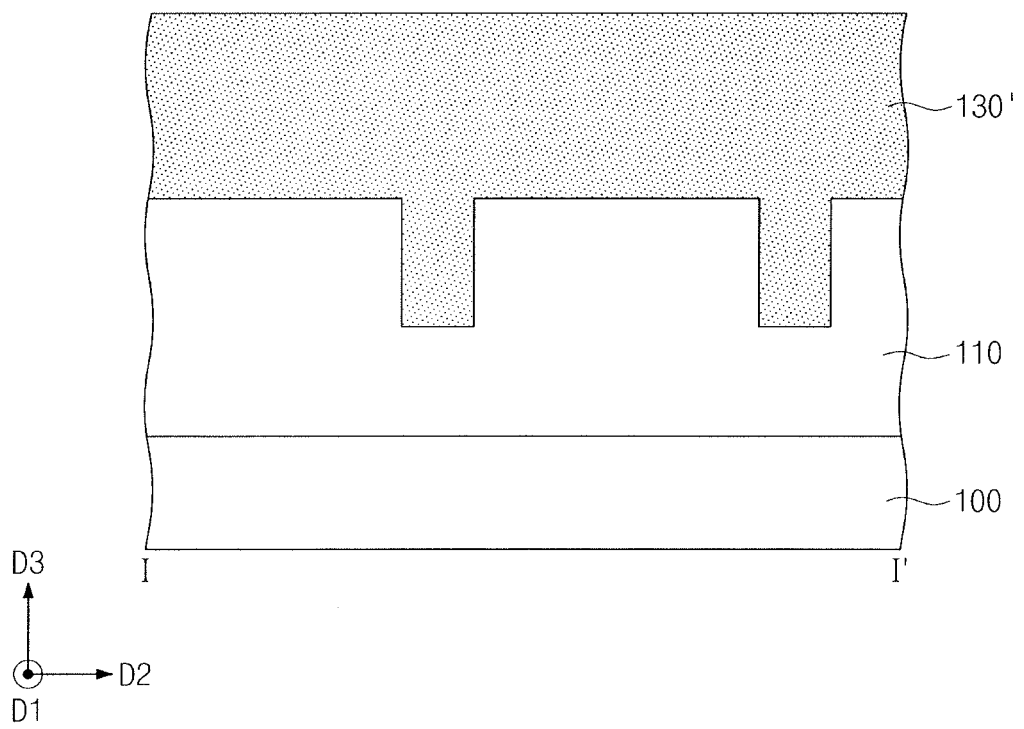

For example, referring to FIGS. 6A and 6B, a blocking layer 130' may be formed on the insulating layer 110. The blocking layer 130' may fill the blocking openings 113 and may be formed on a top surface of the insulating layer 110. The blocking layer 130' may be formed by, e.g., an ALD method, a PVD method, or a CVD method. The blocking layer 130' may include a material having an etch selectivity with respect to the insulating layer 110 and an interconnection structure 150 to be described below. In an implementation, the blocking layer 130' may include, e.g., an oxide, a nitride, and/or an oxynitride.

Figure 7A:
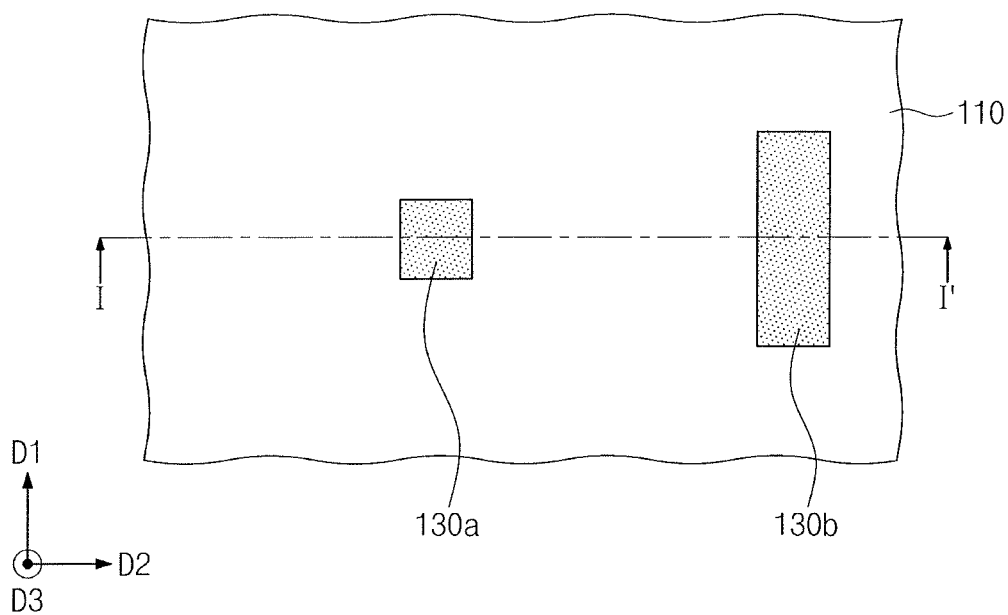
Figure 7B:
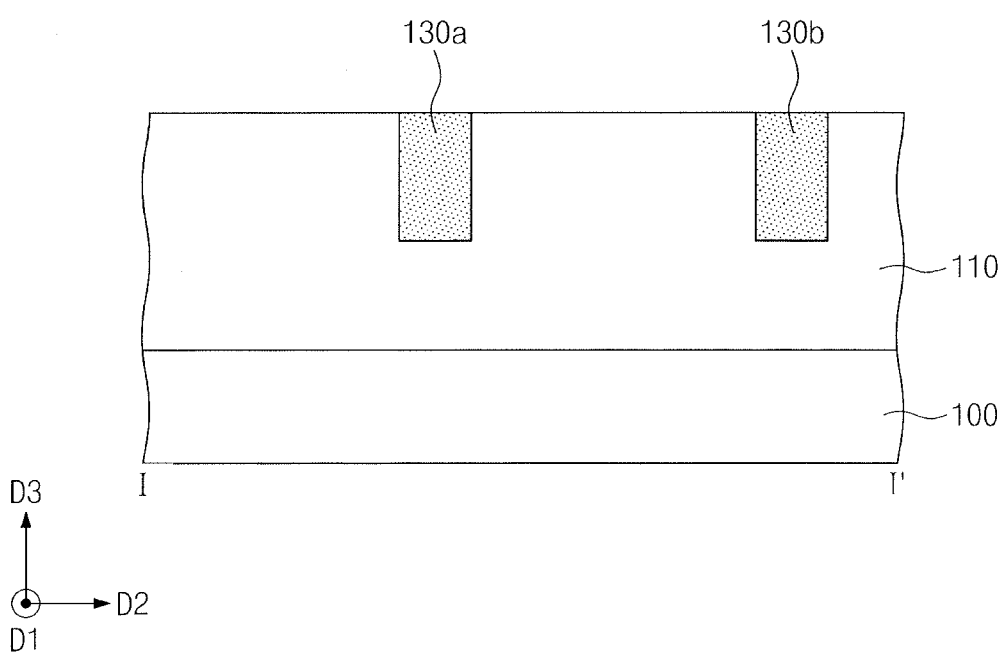

Referring to FIGS. 7A and 7B, the blocking layer 130' may be planarized to form the first and the second blocking patterns 130a, 130b. For example, the blocking layer 130' may be planarized using a chemical mechanical polishing (CMP) process. A top surface of the first and the second blocking patterns 130a, 130b may be substantially coplanar with the top surface of the insulating layer 110.

Referring to FIGS. 2, 8A, 8B, 9A, 9B and 9C, trenches 115 may be formed in the insulating layer 110 (S130).

Figure 8A:
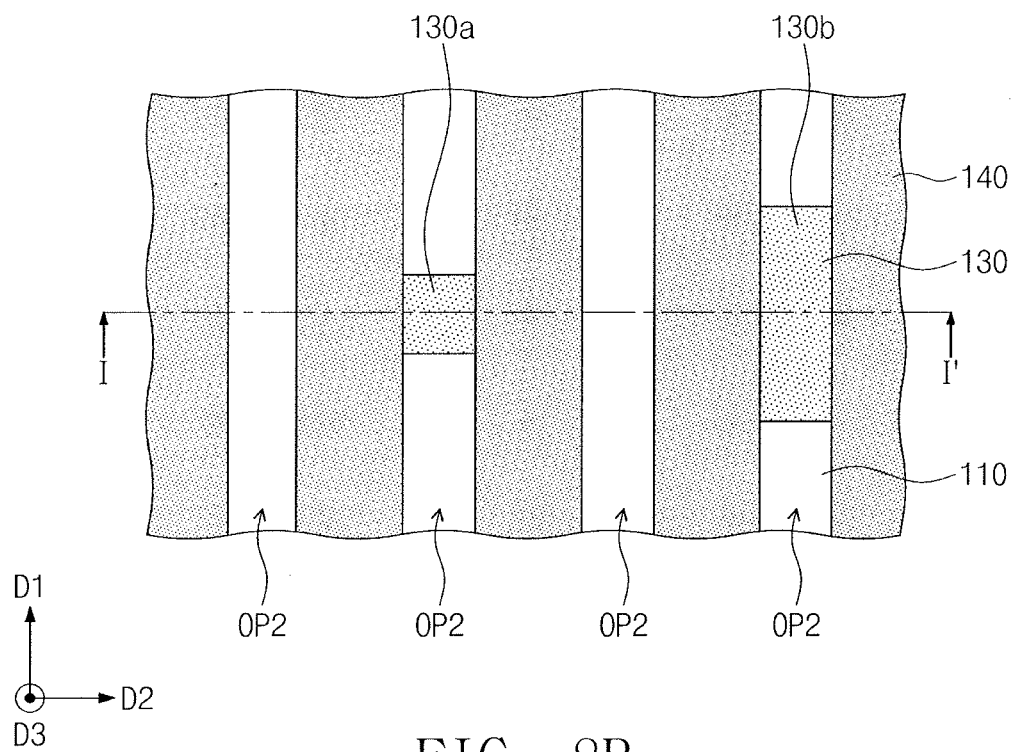
Figure 8B:
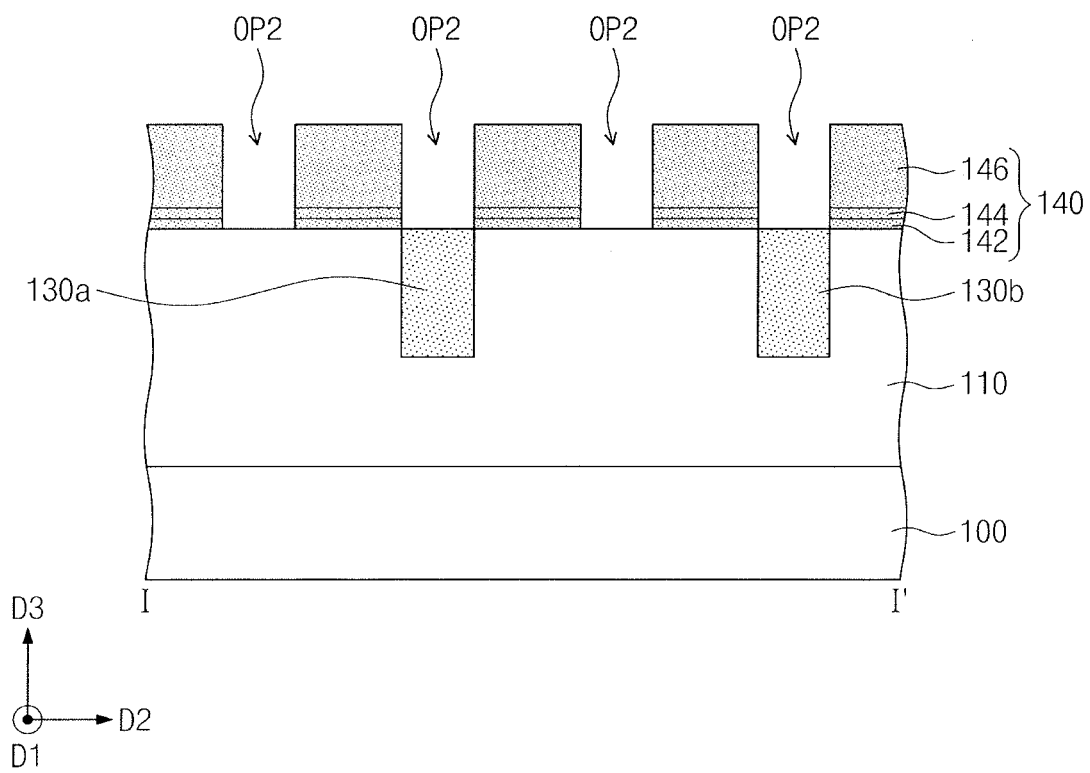

For example, referring to FIGS. 8A and 8B, a second mask pattern portion 140 having second openings OP2 may be formed on the insulating layer 110. The second mask pattern portion 140 may include a fourth mask pattern 142, a fifth mask pattern 144, and a sixth mask pattern 146, which are sequentially stacked. A fourth mask layer, a fifth mask layer, and a sixth mask layer may be sequentially stacked, and the fourth to sixth mask layers may be patterned to form the second mask pattern portion 140. For example, the fourth to sixth mask layers may be patterned using a photoresist pattern. In an implementation, the fourth mask pattern 142 may include TiN, the fifth mask pattern 144 may include SiON, and the sixth mask pattern 146 may include spin-on-hardmask (SOH). In an implementation, the second mask pattern portion 140 may include only one or some of the fourth to sixth mask patterns 142, 144 and 146 or may further include an additional layer.

Figure 9A:
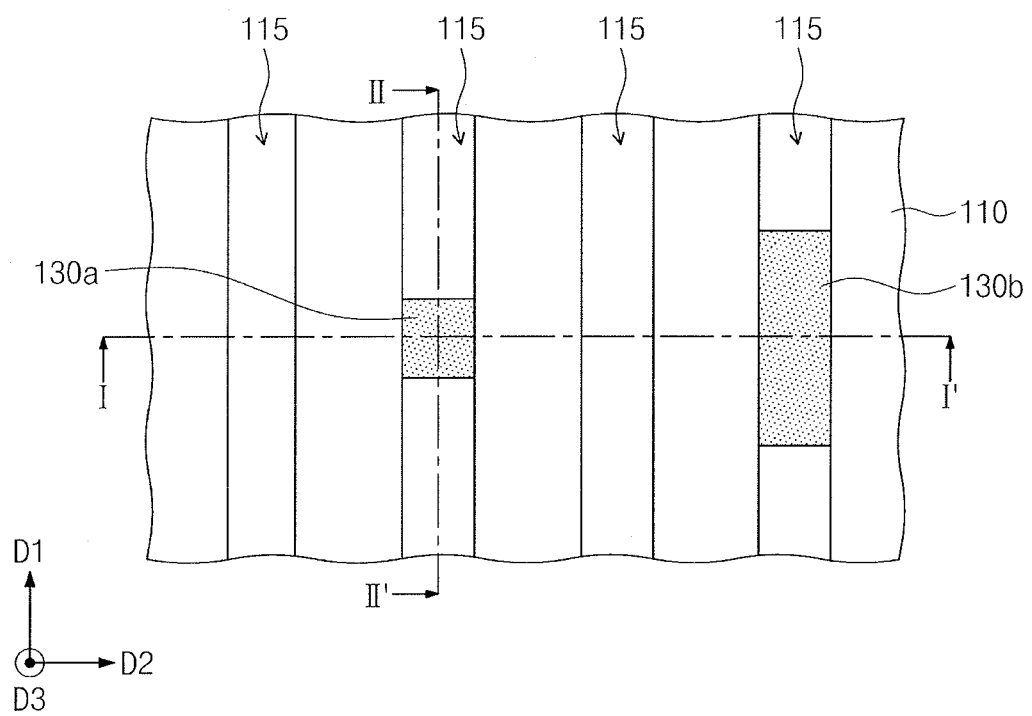
Figure 9B:
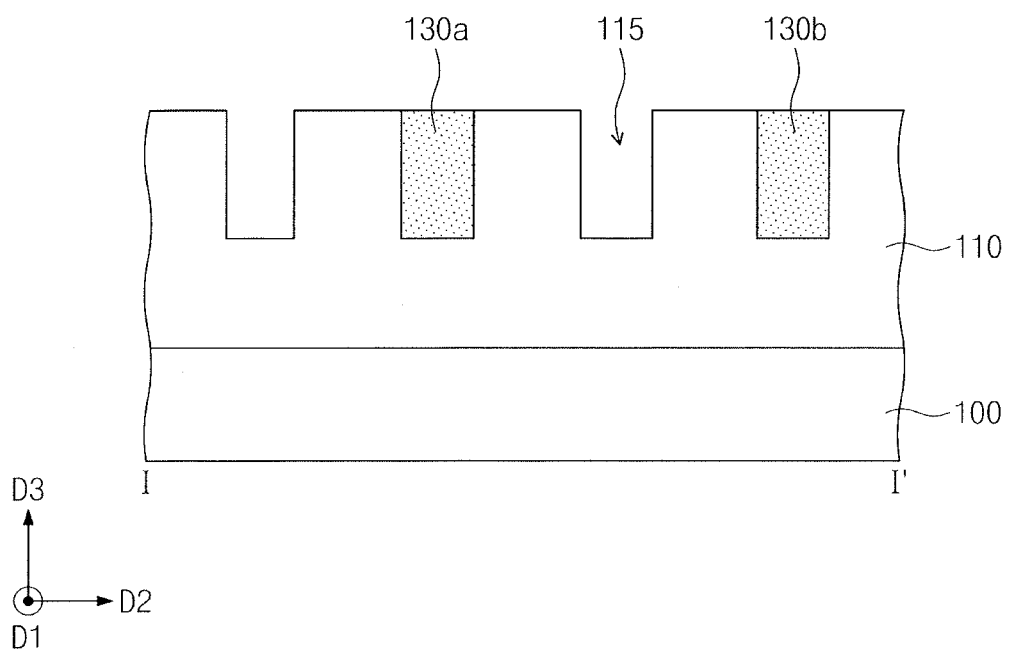
Figure 9C:
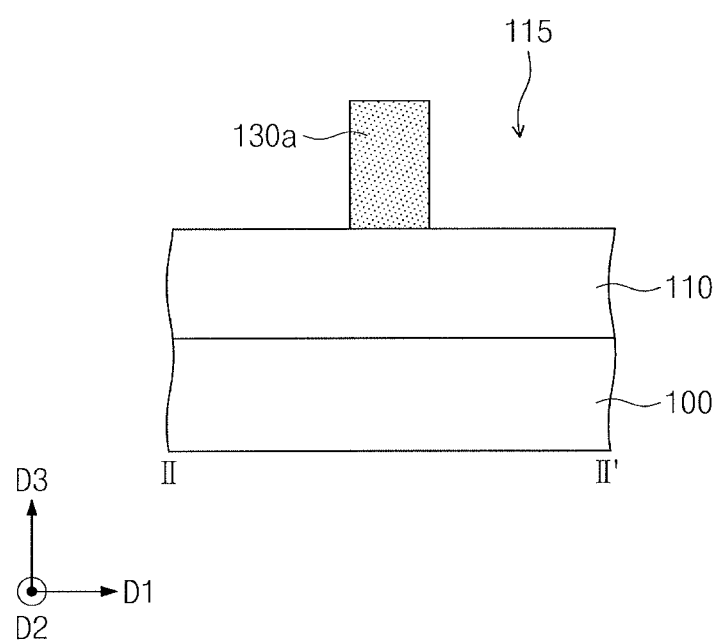
FIGS. 9C and 11C illustrate cross-sectional views taken along lines II-IF of FIGS. 9A and 11A, respectively.

Referring to FIGS. 9A, 9B and 9C, the insulating layer 110 may be etched using the second mask pattern portion 140 as an etch mask to form the trenches 115 (corresponding to the second openings OP2) in the insulating layer 110. The trenches 115 may be formed by etching the insulating layer 110 exposed through the second openings OP2. In an implementation, the insulating layer 110 may be etched using a dry etching process and/or a wet etching process.

Each of the second openings OP2 may extend in the first direction D1. The second openings OP2 may be arranged in the second direction D2. Some of the second openings OP2 may expose portions of the insulating layer 110 and the first and the second blocking patterns 130a, 130b. Some of the second openings OP2 may overlap with the first and the second blocking patterns 130a, 130b when viewed in a plan view. For example, the first and the second blocking patterns 130a, 130b may overlap with the second opening OP2. The first and the second blocking patterns 130a, 130b may include the material having an etch selectivity with respect to the insulating layer 110, and the first and the second blocking patterns 130a, 130b exposed by the second openings OP2 may remain when the insulating layer 110 (exposed by the second openings OP2) is etched, as illustrated in FIG. 9C. Shapes and arrangement of the second openings OP2 of the second mask pattern portion 140 may be the same as shapes and arrangement of interconnection lines provided in the insulating layer 110 of the semiconductor device 1 and may be obtained from, e.g., a layout design of the semiconductor device 1.

Thereafter, the second mask pattern portion 140 may be removed: The second mask pattern portion 140 may be removed by, e.g., ashing/strip processes. The insulating layer 110 having the trenches 115 and the first and the second blocking patterns 130a, 130b may be exposed by the removal of the second mask pattern portion 140.

Each of the trenches 115 may extend in the first direction D1. The trenches 115 may be arranged (e.g., spaced apart) in the second direction D2. The first and the second blocking patterns 130a, 130b may include the material having an etch selectivity with respect to the insulating layer 110, the first and the second blocking patterns 130a, 130b overlapping with a portion of the second opening OP2 may remain, and the trenches 115 may be formed at both sides of the first and the second blocking patterns 130a, 130b in the first direction D1. For example, some of the trenches 115 may have a line shape cut or made discontinuous by the first and the second blocking patterns 130a, 130b. At least portions of both sidewalls of the first and the second blocking patterns 130a, 130b may be exposed by the trenches 115.

In an implementation, the trenches 115 may have sidewalls that are vertical to a top surface of the substrate 100 as illustrated in FIG. 9B. In an implementation, the trenches 115 may have shapes tapered toward the substrate 100.

Referring to FIGS. 2, 10A, 10B, 11A, 11B and 11C, an interconnection structure 150 filling the trenches 115 may be formed (S140).

Figure 10A:
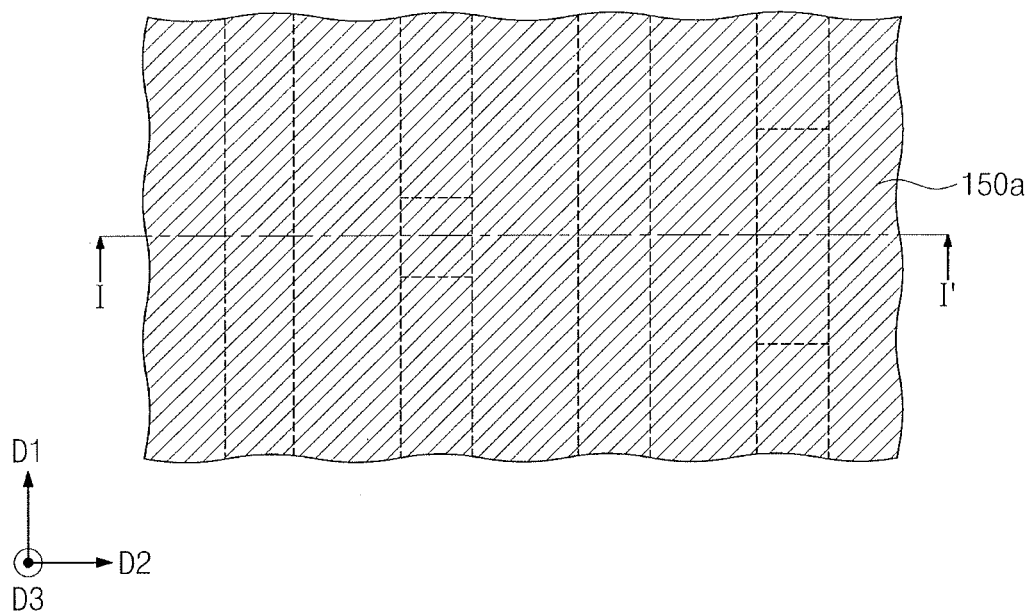
Figure 10B:
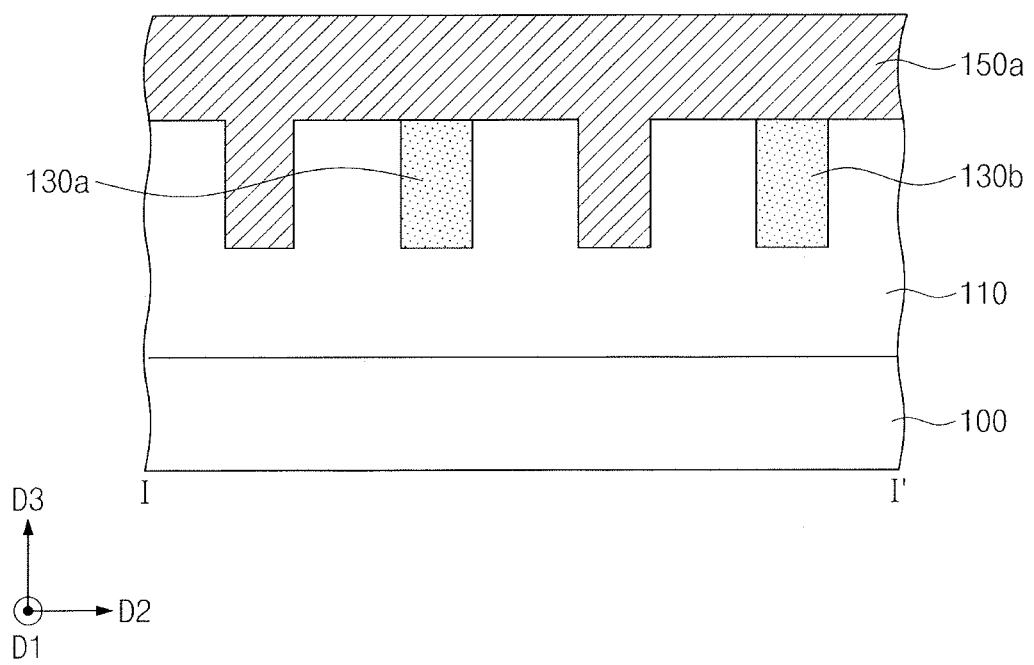

For example, referring to FIGS. 10A and 10B, a metal layer 150a may be formed on the insulating layer 110. The metal layer 150a may fill the trenches 115 and may be formed on the top surface of the insulating layer 110. The metal layer 150a may be formed by, e.g., an ALD method, a PVD method, or a CVD method. In an implementation, the metal layer 150a may include at least one of a metal (e.g., tantalum (Ta), aluminum (Al), copper (Cu), gold (Au), silver (Ag), or titanium (Ti)) or a conductive metal nitride (e.g., tantalum nitride (TaN) or titanium nitride (TiN)). In an implementation, the metal layer 150a may include copper.

Figure 11A:
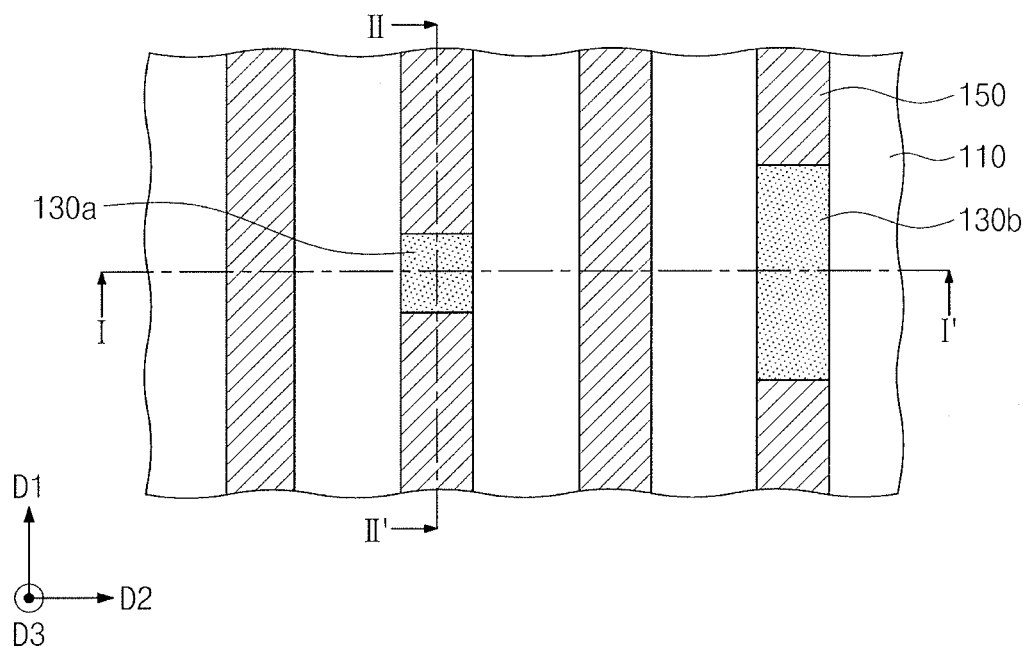
Figure 11B:
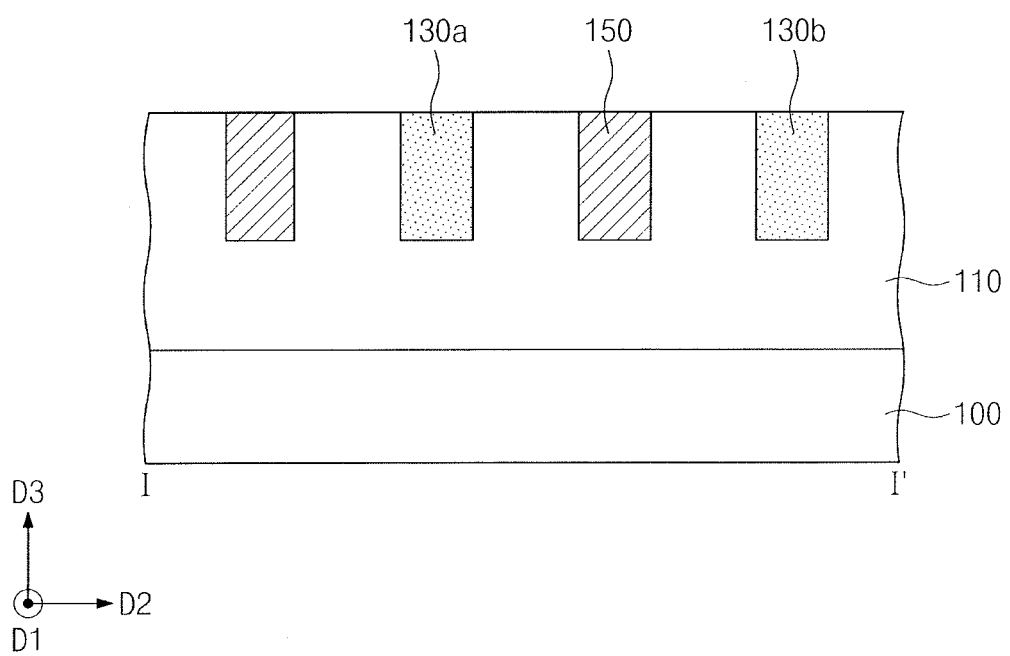
Figure 11C:
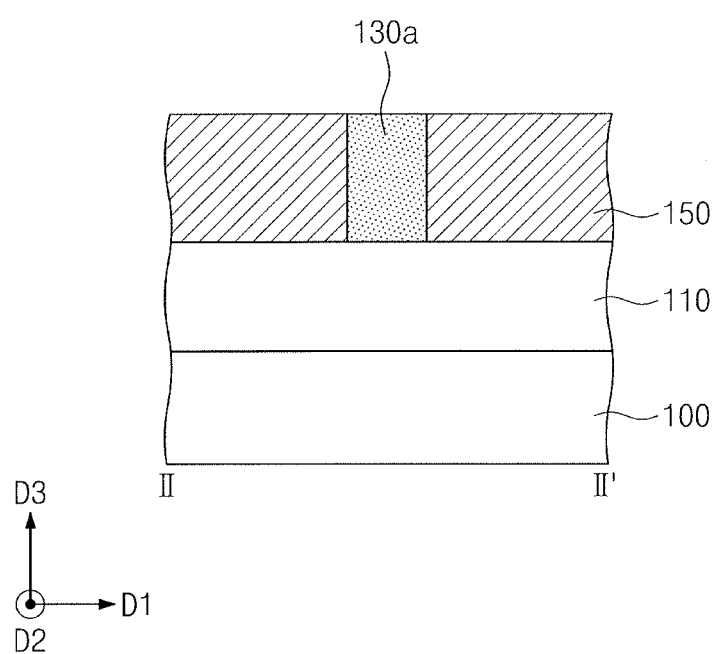

Referring to FIGS. 11A, 11B and 11C, the metal layer 150a may be planarized to form the interconnection structure 150. For example, the metal layer 150a may be planarized using a chemical mechanical polishing (CMP) process. The interconnection structure 150 may include a plurality of interconnection lines 150. In the present specification, the interconnection structure 150 may be referred to as the interconnection lines 150 where appropriate. The interconnection lines 150 may include the interconnection lines 152, 154 and 156 described above with reference to FIGS. 1A and 1B. Top surfaces of the interconnection lines 150 may be substantially coplanar with the top surface of the insulating layer 110.

Each of the interconnection lines 150 may extend in the first direction D1. The interconnection lines 150 may be arranged (e.g., spaced apart) in the second direction D2. Some of the interconnection lines 150 may be in contact with the first and the second blocking patterns 130a, 130b. For example, some of the interconnection lines 150 may have line shapes cut or made discontinuous by the first and the second blocking patterns 130a, 130b. The interconnection lines 150 may include two or more interconnection lines (see 152, 154, 156, 159 and 161 of FIG. 1A) spaced apart from each other with each of the first and the second blocking patterns 130a, 130b therebetween.

Referring to FIGS. 2, 12A, 12B, 13A and 13B, gap regions 117 may be formed between the interconnection lines 150 (S150).

Figure 12A:
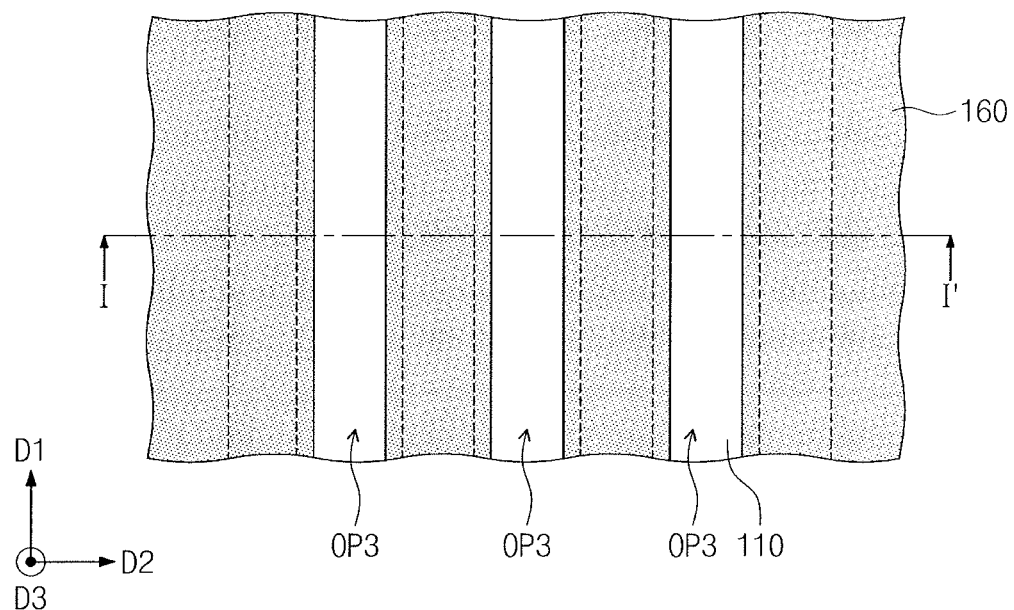
Figure 12B:
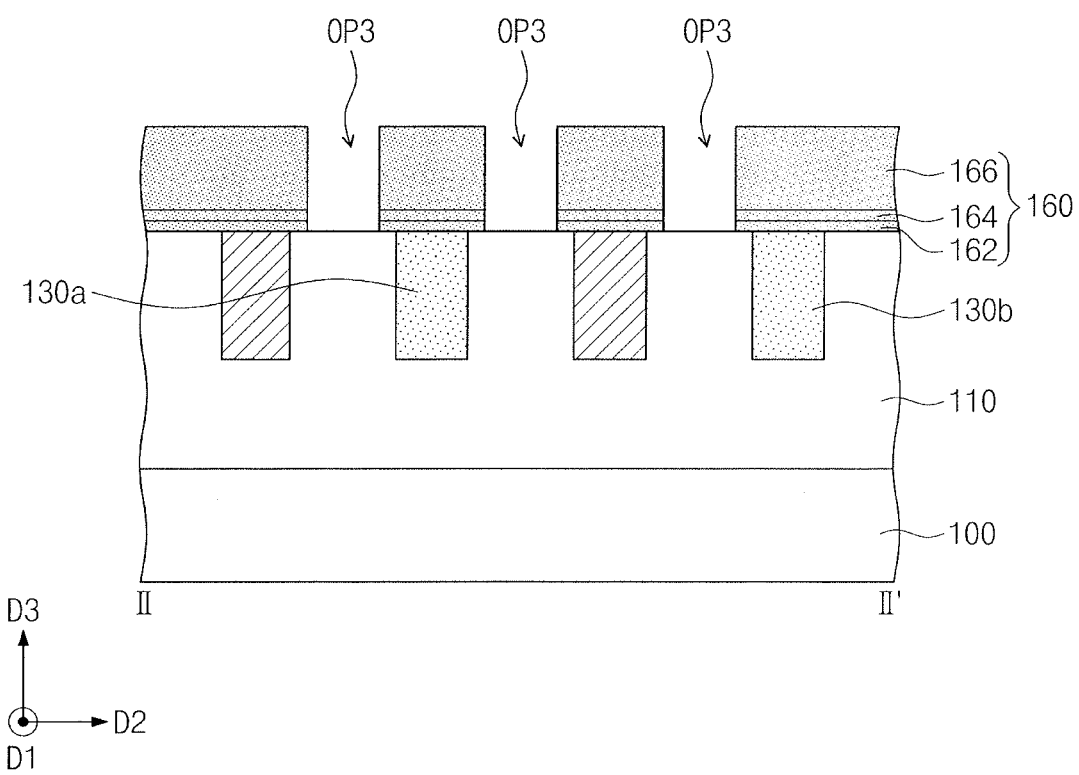

For example, referring to FIGS. 12A and 12B, a third mask pattern portion 160 having third openings OP3 may be formed on the insulating layer 110. The third mask pattern portion 160 may include a seventh mask pattern 162, an eighth mask pattern 164, and a ninth mask pattern 166, which are sequentially stacked. A seventh mask layer, an eighth mask layer, and a ninth mask layer may be sequentially stacked, and the seventh to ninth mask layers may be patterned to form the third mask pattern portion 160. For example, the seventh to ninth mask layers may be patterned using a photoresist pattern. In an implementation, the seventh mask pattern 162 may include TiN, the eighth mask pattern 164 may include SiON, and the ninth mask pattern 166 may include spin-on-hardmask (SOH). In an implementation, the third mask pattern portion 160 may include only one or some of the seventh to ninth mask patterns 162, 164 and 166 or may further include an additional layer.

Each of the third openings OP3 may extend (e.g., in parallel) in the first direction D1. The third openings OP3 may be arranged (e.g., spaced apart) in the second direction D2. In an implementation, the third openings OP3 may have line shapes between the interconnection lines 150 and between the interconnection lines 150 and the first and the second blocking patterns 130a, 130b when viewed in a plan view. In an implementation, the third opening OP3 may not have the line shape exposing a region between adjacent interconnection lines 150 but may expose an entire region between outermost air gaps to be formed. In an implementation, a width of the third opening OP3 in the second direction D2 may be less than a width between the interconnection lines 150 in the second direction D2 as illustrated in FIGS. 12A and 12B. In an implementation, the width of the third opening OP3 may be greater than the width between the interconnection lines 150.

Figure 13A:
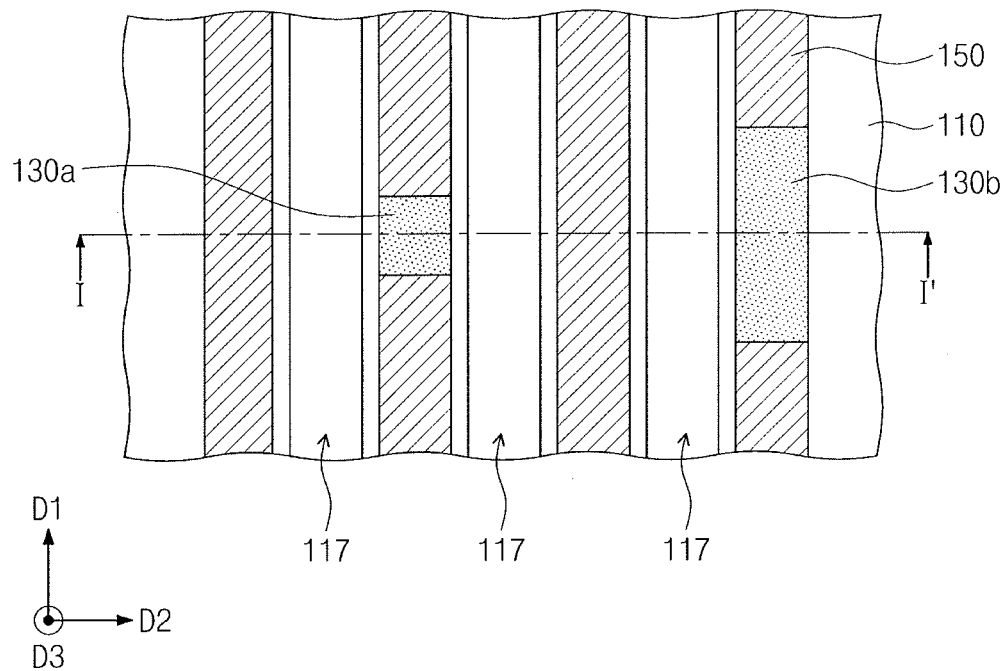
Figure 13B:
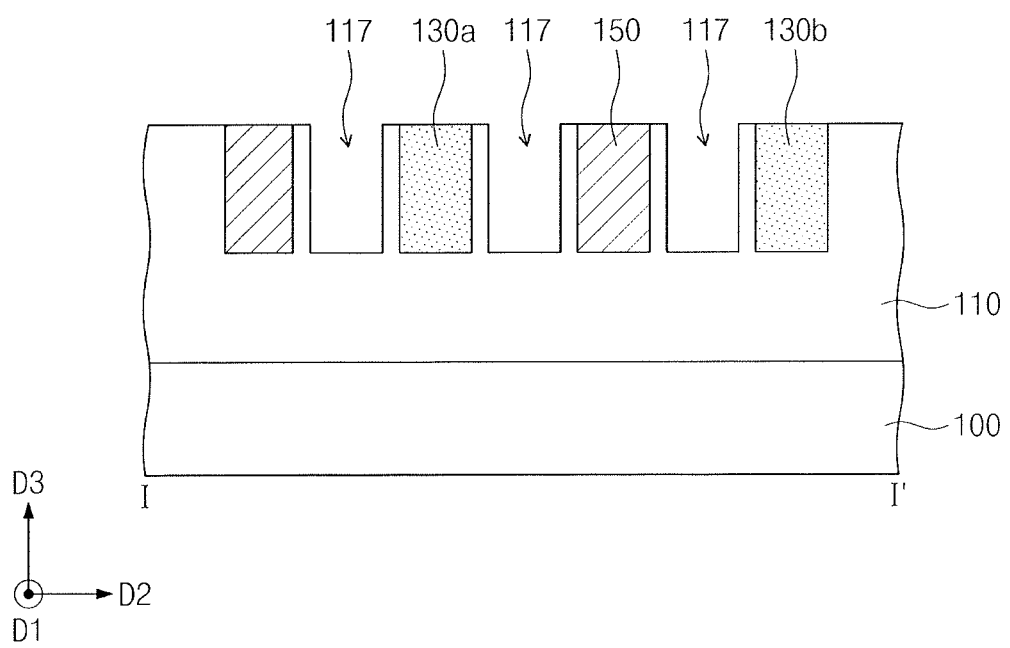

Referring to FIGS. 13A and 13B, the insulating layer 110 may be etched using the third mask pattern portion 160 as an etch mask to form the gap regions 117 (corresponding to the third openings OP3) in the insulating layer 110. The gap regions 117 may be formed by etching the insulating layer 110 exposed through the third openings OP3. In an implementation, the insulating layer 110 may be etched using a dry etching process and/or a wet etching process.

Thereafter, the third mask pattern portion 160 may be removed. The third mask pattern portion 160 may be removed by, e.g., ashing/strip processes. The insulating layer 110 having the gap regions 117, the interconnection lines 150, and the first and the second blocking patterns 130a, 130b may be exposed by the removal of the third mask pattern portion 160.

The gap regions 117 may extend in the first direction D1. The gap regions 117 may be between the interconnection lines 150. The gap regions 117 may also be between each of the first and the second blocking patterns 130a, 130b and the interconnection lines 150 (adjacent to each of the first and the second blocking patterns 130a, 130b). In an implementation, the gap regions 117 may have sidewalls vertical to the top surface of the substrate 100 as illustrated in FIG. 13B. In an implementation, the gap regions 117 may have shapes tapered toward the substrate 100.

Referring again to FIGS. 1A, 1B and 2, a capping layer 170 capping the gap regions 117 may be formed to form air gaps AG (S160). The capping layer 170 may be formed using a material having poor step coverage or poor conformality. The capping layer 170 may be formed by, e.g., a PVD method or an electroless plating method. In an implementation, the capping layer 170 may be formed on an entire portion of the insulating layer 110, as illustrated in FIG. 1B. In an implementation, the capping layer 170 may be deposited and then be patterned to form a capping pattern covering a top end of each of the air gaps AG. In the present specification, an ideal case in which sidewalls of the air gap AG are vertical to a top surface of the substrate 100 is illustrated for the purpose of ease and simplicity in illustration. In an implementation, an upper portion of the air gap AG may be narrower than a lower portion of the air gap AG.

An upper insulating layer may be on the capping layer 170, and an upper interconnection structure may be on the upper insulating layer. Vias for electrically connecting the upper interconnection structure and the interconnection structure 150 may be additionally provided.

As described above, in the method of fabricating the semiconductor device 1, the interconnection lines 150 and the first and the second blocking patterns 130a, 130b between the end portions of the interconnection lines 150 may be formed using layout data, and the air gaps AG may be formed between the interconnection lines 150 and between the interconnection lines 150 and the first and the second blocking patterns 130a, 130b by using the layout data. Thus, the air gaps AG may be easily formed in regions, in which the interconnection lines 150 are cut, without limitations (e.g., a margin limitation required to form a mask). As a result, the air gaps AG may be widened and a parasitic capacitance may be reduced.

Figure 14:
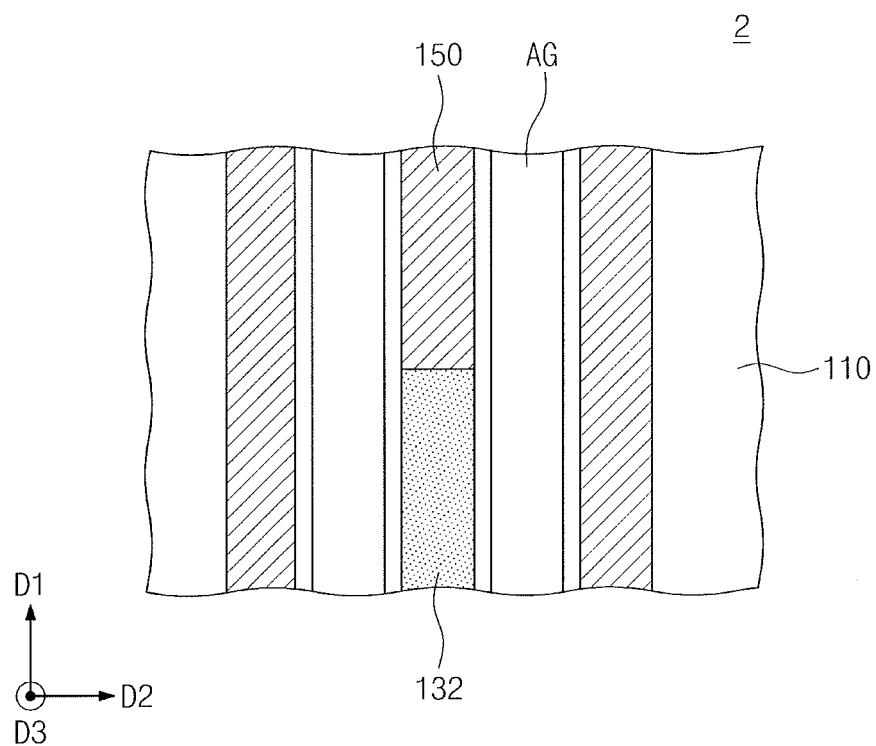
FIG. 14 illustrates a plan view of a semiconductor device according to some embodiments.

FIG. 14 illustrates a plan view of a semiconductor device 2 according to some embodiments. The semiconductor device 2 may include a substrate 100, an insulating layer 110, an interconnection structure 150, a blocking pattern 132, and air gaps AG. The substrate 100, the insulating layer 110, the interconnection structure 150, and the air gaps AG may be substantially the same or similar as described with reference to FIGS. 1A and 1B, and thus repeated descriptions thereof may be omitted.

The blocking pattern 132 of FIG. 14 may have a line shape extending in one direction. For example, the blocking pattern 132 may extend in the first direction D1. For example, the first and the second blocking patterns 130a, 130b of FIG. 1 may be between the end portions of the interconnection lines 150, and the blocking pattern 132 of FIG. 14 may extend in the one direction. In this case, the air gaps AG may be formed between the blocking pattern 132 and the interconnection lines 150, and thus the blocking pattern 132 and the air gap AG may be applied to various designs to increase a degree of freedom of design.

Figure 15:
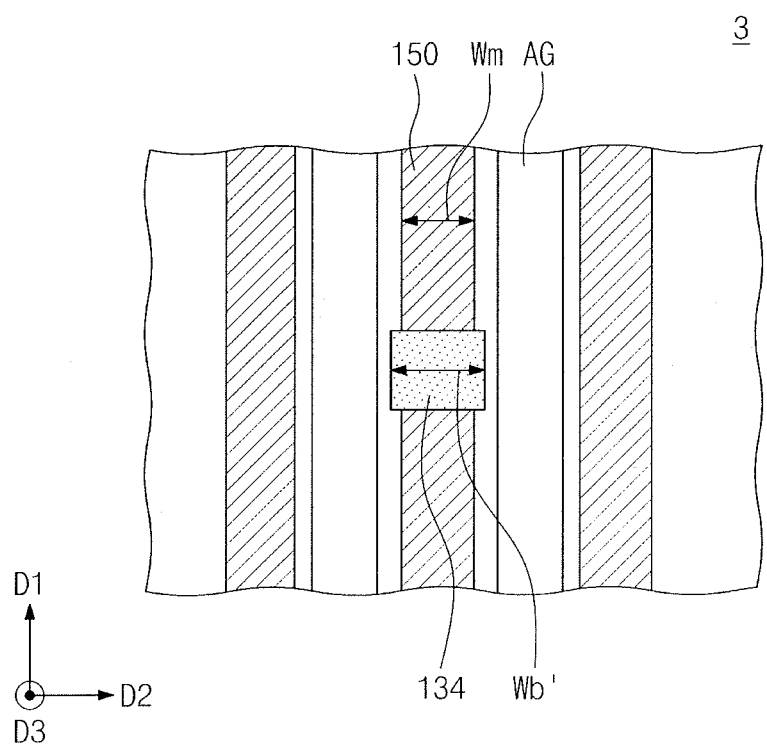
FIG. 15 illustrates a plan view of a semiconductor device according to some embodiments.

FIG. 15 illustrates a plan view of a semiconductor device 3 according to some embodiments. The semiconductor device 3 may include a substrate 100, an insulating layer 110, an interconnection structure 150, a blocking pattern 134, and air gaps AG. The substrate 100, the insulating layer 110, the interconnection structure 150, and the air gaps AG may be substantially the same or similar as described with reference to FIGS. 1A and 1B, and thus repeated descriptions thereof may be omitted.

A width Wb' of the blocking pattern 134 of FIG. 15 may be wider than the width Wm of the interconnection lines 150. For example, the width Wb' of the blocking pattern 134 in the second direction D2 may be greater than the width Wm of the interconnection lines 150 in the second direction D2. Thus, the blocking pattern 134 may enhance insulation between the interconnection lines 150 (of which the end portions face each other). Portions of both sidewalls of the blocking pattern 134 may be in contact with the interconnection lines 150. A size of the blocking pattern 134 may be controlled as desired, and thus the blocking pattern 134 may be applied to various designs to increase a degree of freedom of design.

Figure 16:
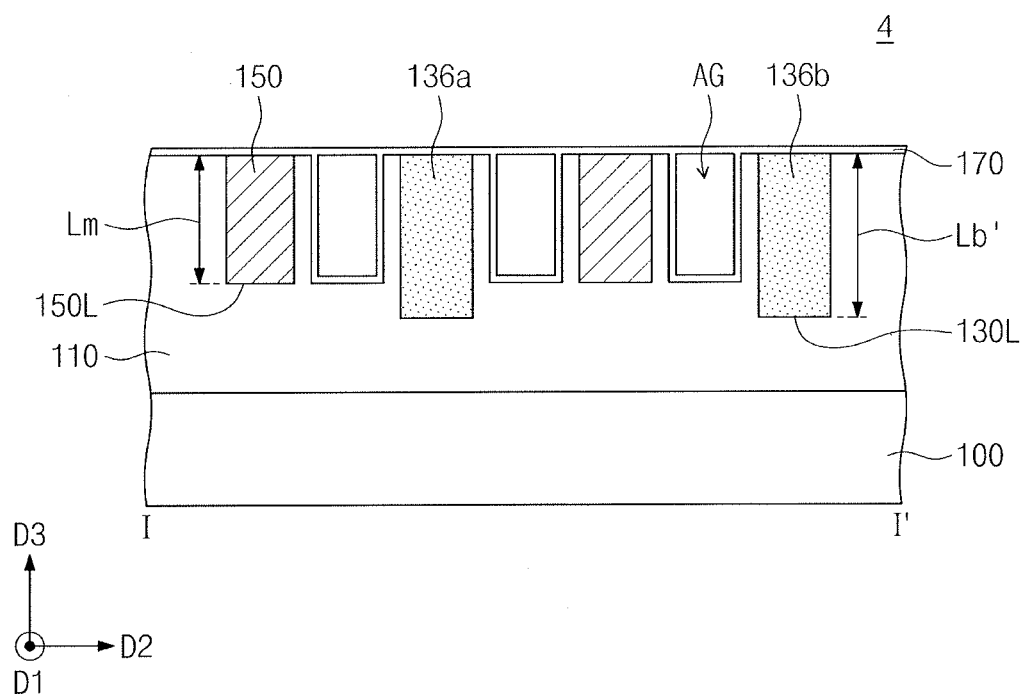
FIG. 16 illustrates a cross-sectional view of a semiconductor device according to some embodiments.

FIG. 16 illustrates a cross-sectional view of a semiconductor device 4 according to some embodiments. The semiconductor device 4 may include a substrate 100, an insulating layer 110, an interconnection structure 150, first and second blocking patterns 136a, 136b, and air gaps AG. The substrate 100, the insulating layer 110, the interconnection structure 150, and the air gaps AG may be substantially the same or similar as described with reference to FIGS. 1A and 1B, and thus repeated descriptions thereof may be omitted.

A level Lb' of a bottom surface 130L (e.g., depth) of the first and the second blocking patterns 136a, 136b of FIG. 16 may be lower (e.g., deeper) than the level Lm of the bottom surface 150L of at least one of the interconnection lines 150. The level Lb' of the bottom surface 130L of the first and the second blocking patterns 136a, 136b may be lower (e.g., closer to the substrate 100) than the level Lm of the bottom surface 150L of each of the interconnection lines 150. The term 'level' used herein may mean a distance from a top surface of the insulating layer 110 in a direction toward the substrate 100. In an implementation, the levels of the bottom surfaces of the interconnection lines 150 may be substantially the same as each other. The first and the second blocking patterns 136a, 136b may have an etch selectivity with respect to the insulating layer 110, and the gap regions 117 (see FIG. 12B) for forming the air gaps AG between the first and the second blocking patterns 136a, 136b and the interconnection lines 150 may be more stably formed when the level Lb' of the bottom surface 130L of the first and the second blocking patterns 136a, 136b are lower than the levels Lm of the bottom surfaces 150L of the interconnection lines 150. In an implementation, the gap regions 117 may be formed in such a way that levels of bottom surfaces of the gap regions 117 are lower than the levels Lm of the bottom surfaces 150L of the interconnection lines 150, and thus sizes of the air gaps AG may be increased.

By way of summation and review, operating speeds of semiconductor devices could be reduced by an increase in parasitic capacitance thereof. Various methods (e.g., a lowresistance metal interconnection line and/or a low-k dielectric) for reducing the parasitic capacitance have been considered.

One or more embodiments may provide a semiconductor device including air gaps and a method of fabricating the same.

According to one or more embodiments, a semiconductor device with improved reliability may be provided.

According to one or more embodiments, a semiconductor device with a reduced parasitic capacitance may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first interconnection line having a first end and extending in a first direction;
a first blocking pattern at the first end of the first interconnection line and adjacent to the first interconnection line in the first direction;
a second interconnection line spaced apart from the first interconnection line in a second direction crossing the first direction and extending in the first direction, the second interconnection line having a second end; and
a second blocking pattern at the second end of the second interconnection line and adjacent to the second interconnection line in the first direction,
wherein a width of the first blocking pattern in the first direction is different from a width of the second blocking pattern in the first direction.

2. The semiconductor device of claim 1, further comprising a first air gap and a second air gap spaced apart from each other with the first blocking pattern therebetween,
wherein the first air gap and the second air gap extend in the first direction.

3. The semiconductor device of claim 1, further comprising a capping layer enclosing the first and the second air gaps,
wherein the capping layer covers upper surfaces of the first and the second interconnection lines and upper surfaces of the first and the second blocking patterns.

4. The semiconductor device of claim 1, further comprising a third interconnection line having a third end and extending in the first direction,
wherein:
the third end of the third interconnection line is opposite to the first end of the first interconnection line in the first direction, and
the first blocking pattern is between the first interconnection line and the third interconnection line.

5. The semiconductor device of claim 1, wherein a width of the first blocking pattern in the second direction is the same as a width of the first interconnection line in the second direction.

6. The semiconductor device of claim 1, wherein a width of the first blocking pattern in the second direction is larger than a width of the first interconnection line in the second direction.

7. The semiconductor device of claim 1, further comprising:
a substrate; and
an insulating layer on the substrate,
wherein:
the first interconnection line, the first blocking pattern, the second interconnection line, and the second blocking pattern are in the insulating layer, and
the first blocking pattern and the second blocking pattern include a material having an etching selectivity with respect to the insulating layer.

8. The semiconductor device of claim 1, further comprising:
a substrate; and
an insulating layer on the substrate,
wherein:
the first interconnection line, the first blocking pattern, the second interconnection line, and the second blocking pattern are in the insulating layer, and
a level of a bottom surface of the first interconnection line and a level of a bottom surface of the second interconnection line are the same as a level of a bottom surface of the first blocking pattern and a level of a bottom surface of the second blocking pattern.

9. The semiconductor device of claim 1, further comprising:
a substrate; and
an insulating layer on the substrate,
wherein:
the first interconnection line, the first blocking pattern, the second interconnection line, and the second blocking pattern are in the insulating layer, and
a level of a bottom surface of the first interconnection line and a level of a bottom surface of the second interconnection line are higher than a level of a bottom surface of the first blocking pattern and a level of a bottom surface of the second blocking pattern.

10. The semiconductor device of claim 1, further comprising a third interconnection line between the first interconnection line and the second interconnection line and extending in the first direction.

11. The semiconductor device of claim 1, wherein the first blocking pattern and the second blocking pattern are opposed to each other in the second direction.

12. The semiconductor device of claim 1, wherein the first blocking pattern and the second blocking pattern include at least one of an oxide and a nitride.

13. A semiconductor device, comprising:
an insulating layer on a substrate;
a first interconnection line and a second interconnection line in the insulating layer and opposed to each other in a first direction, the first interconnection line and the second interconnection line extending in the first direction;
a first blocking pattern between the first interconnection line and the second interconnection line in the insulating layer;
an air gap at one side of the first blocking pattern in the insulating layer and extending in the first direction; and
a capping layer enclosing the air gap in the insulating layer and covering an upper portion of the air gap,
wherein the capping layer covers upper surfaces of the first and the second interconnection lines, an upper surface of the first blocking pattern, and an upper surface of the insulating layer.

14. The semiconductor device of claim 13, further comprising a third interconnection line at one side of the air gap in the insulating layer and extending in the first direction,
wherein the air gap is between the first blocking pattern and the third interconnection line, between the first interconnection line and the third interconnection line, and between the second interconnection line and the third interconnection line.

15. The semiconductor device of claim 13, wherein the first blocking pattern includes a material having an etching selectivity with respect to the insulating layer.

16. The semiconductor device of claim 13, further comprising:
a third interconnection line and a fourth interconnection line spaced apart from each other, the third and the fourth interconnection lines opposing each other in the first direction and extending in the first direction; and
a second blocking pattern between the third interconnection line and the fourth interconnection line in the insulating layer,
wherein a width of the first blocking pattern in the first direction is smaller than a width of the second blocking pattern in the first direction.

17. The semiconductor device of claim 13, wherein a level of a bottom surface of the first blocking pattern is lower than a level of a bottom surface of the first interconnection line and a level of a bottom surface of the second interconnection line.

18. The semiconductor device of claim 13, wherein a level of a bottom surface of the first blocking pattern is the same as a level of a bottom surface of the first interconnection line and a level of a bottom surface of the second interconnection line.

19. The semiconductor device of claim 13, wherein a width of the first blocking pattern in a second direction crossing the first direction is the same as widths of the first interconnection line and the second interconnection line in the second direction.

20. A semiconductor device, comprising:
an insulating layer on a substrate;
a first interconnection line and a second interconnection line in the insulating layer and opposed to each other in a first direction, the first interconnection line and the second interconnection line extending in the first direction;
a first blocking pattern between the first interconnection line and the second interconnection line in the insulating layer; and
an air gap at one side of the first blocking pattern in the insulating layer and extending in the first direction,
wherein a level of a bottom surface of the first blocking pattern is the same as or lower than a level of a bottom surface of the first interconnection line and a level of a bottom surface of the second interconnection line.

* * * * *